(12) United States Patent
Kim et al.

(10) Patent No.: US 8,940,584 B2
(45) Date of Patent: Jan. 27, 2015

(54) SEMICONDUCTOR PACKAGES AND METHODS OF FORMING THE SAME

(71) Applicant: Samsung Electronics Co., Ltd., Suwon-Si, Gyeonggi-Do (KR)

(72) Inventors: Tongsuk Kim, Hwaseong-si (KR); Jangwoo Lee, Cheonan-si (KR); Heeseok Lee, Yongin-si (KR); Kyoungsei Choi, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/272,681

(22) Filed: May 8, 2014

(65) Prior Publication Data

US 2014/0239477 A1 Aug. 28, 2014

Related U.S. Application Data

(62) Division of application No. 13/588,450, filed on Aug. 17, 2012, now Pat. No. 8,748,228.

(30) Foreign Application Priority Data

Aug. 23, 2011 (KR) ........................ 10-2011-0084108

(51) Int. Cl.
*H01L 21/44* (2006.01)
*H01L 23/06* (2006.01)
(Continued)

(52) U.S. Cl.
CPC ................ *H01L 23/06* (2013.01); *H01L 23/10* (2013.01); *H01L 23/3128* (2013.01); *H01L 23/552* (2013.01); *H01L 23/49816* (2013.01); *H01L 21/563* (2013.01); *H01L 23/34* (2013.01); *H01L 25/0657* (2013.01); *H01L 2224/16145* (2013.01); *H01L 2224/16225* (2013.01); *H01L 2224/32145* (2013.01); *H01L 2224/32245* (2013.01); *H01L 2224/73204* (2013.01); *H01L 2224/73253* (2013.01); *H01L 2924/15311* (2013.01); *H01L 2924/16172* (2013.01); *H01L 2924/16251* (2013.01); *H01L 2225/06568* (2013.01); *H01L 23/36* (2013.01); *H01L 23/42* (2013.01); *A01L 23/562* (2013.01)
USPC ........... 438/118; 438/107; 438/108; 438/116; 438/122; 438/127

(58) Field of Classification Search
None
See application file for complete search history.

(56) References Cited

U.S. PATENT DOCUMENTS

| 6,225,694 | B1 * | 5/2001 | Terui .............................. 257/704 |
| 6,967,403 | B2 * | 11/2005 | Chuang et al. ................ 257/717 |
| 2007/0001313 | A1 | 1/2007 | Fujimoto et al. |

FOREIGN PATENT DOCUMENTS

| KR | 20-0189316 Y1 | 7/2000 |
| KR | 10-0706516 | 8/2002 |
| KR | 20030041653 A | 5/2003 |

*Primary Examiner* — Kyoung Lee
(74) *Attorney, Agent, or Firm* — Harness, Dickey & Pierce, P.L.C.

(57) ABSTRACT

A semiconductor package including a package substrate having a chip mounting region and a peripheral region and including a ground layer formed in the peripheral region, first solder balls on the package substrate in the chip mounting region, second solder balls on the ground layer, at least one semiconductor chip stacked on the package substrate in the chip mounting region, and a package cap covering the semiconductor chip and contacting the package substrate in the peripheral region may be provided. The package cap is electrically connected to the second solder balls. Methods of fabricating the semiconductor package are also provided.

13 Claims, 8 Drawing Sheets

(51) Int. Cl.
*H01L 23/10* (2006.01)
*H01L 23/31* (2006.01)
*H01L 23/552* (2006.01)
*H01L 23/498* (2006.01)
*H01L 21/56* (2006.01)
*H01L 23/34* (2006.01)
*H01L 25/065* (2006.01)
*H01L 23/36* (2006.01)
*H01L 23/42* (2006.01)

SEMICONDUCTOR PACKAGES AND METHODS OF FORMING THE SAME

CROSS-REFERENCE TO RELATED APPLICATIONS

This U.S. non-provisional patent application is a divisional of U.S. patent application Ser. No. 13/588,450, filed on Aug. 17, 2012, which claims priority under 35 U.S.C. §119 to Korean Patent Application No. 10-2011-0084108, filed on Aug. 23, 2011, in the Korean Intellectual Property Office (KIPO), the disclosure of each of which is hereby incorporated by reference in its entirety.

BACKGROUND

1. Field

Example embodiments relate to semiconductor packages and/or methods of forming the same.

2. Description of the Related Art

In a recent electronic industry, small and slim printed circuit boards (PCBs) have been increasingly demanded with the development of thinner, lighter, smaller, slimmer and higher packing density of electronic products. In addition, design schemes of the printed circuit boards become more complicated and require advanced technologies because of more multi-function and portability of the electronic products as well as because of transmittance and reception of a large capacity of data. Thus, multi-layered PCBs including power supply lines, ground lines and signal lines have been proposed to accommodate ever-evolving design complexity.

Various semiconductor chips, for example, central processing unit (CPU) chips and/or power integrated circuit chips may be mounted on the multi-layered PCBs. These semiconductor chips may generate heat during operation, and the heat from the semiconductor chips may cause malfunction of the semiconductor chips.

In the event that a plurality of semiconductor chips are mounted on a printed circuit board, electromagnetic interference (EMI) may occur between the plurality of semiconductor chips. This EMI may also cause malfunction of the semiconductor chips.

SUMMARY

At least some example embodiments are directed to methods of fabricating semiconductor packages.

According to an example embodiment, a method of fabricating a semiconductor package may include forming a package substrate having a chip mounting region and a peripheral region, the package substrate being formed to include a ground layer on the peripheral region thereof, forming first solder balls on the package substrate in the chip mounting region and forming second solder balls on the package substrate in the peripheral region, respectively, mounting a semiconductor chip on the package substrate in the chip mounting region, and mounting a package cap on the package substrate covering the semiconductor chip. The package cap may be electrically connected to the second solder balls.

The forming second solder balls may include forming a protection layer exposing the ground layer on the package substrate and forming second solder balls on the exposed ground layer. The forming first and second solder balls may be simultaneously performed.

The mounting a semiconductor chip may include bonding the semiconductor chip to the first solder balls formed in the chip mounting region and forming an under-fill resin layer filling a space between the semiconductor chip and the package substrate.

The mounting a package cap may include attaching the package cap to the package substrate using an adhesive pattern.

The mounting a package cap may include installing the package cap including conductive metal.

The method of fabricating a semiconductor package may further include forming a thermal interface material layer on the semiconductor chip to contact the package cap.

According to an example embodiment, a method of fabricating a semiconductor package may include forming a package substrate having a chip mounting region and a peripheral region and formed to include a ground layer on the peripheral region thereof, forming a mixture material on the package substrate, the mixture material including solder particles and adhesive resin, heating the mixture material to a temperature over a melting point of the solder particles, mounting a semiconductor chip on the mixture material in the chip mounting region, and mounting a package cap on the package substrate to cover the semiconductor chip. Edges of the package cap may be disposed on the mixture material in the peripheral region.

The forming a mixture material may include coating adhesive resin having solder particles therein on the package substrate.

The mixture material may further include at least one of a reducing agent, a deforming agent and a hardening agent, and the hardening agent may include a silicon type material, a phenol type material, an acid anhydride type material or an amine type material.

The mixture material may further include a thermal setting agent, a thermal plastic agent or an ultraviolet curing material.

The mounting a package cap may include installing the package cap including conductive metal.

According to an example embodiment, the method of fabricating a semiconductor package may further include forming a thermal interface material layer on the semiconductor chip to contact the package cap.

Further, example embodiments are directed to semiconductor packages.

According to an example embodiment, a semiconductor package may include a package substrate having a chip mounting region and a peripheral region and including a ground layer in the peripheral region, first solder balls on the package substrate in the chip mounting region, second solder balls on the ground layer, at least one semiconductor chip on the package substrate in the chip mounting region and electrically connected to the first solder balls, and a package cap covering the semiconductor chip and contacting the package substrate in the peripheral region. The package cap may be electrically connected to the second solder balls.

The package substrate may include a plurality of insulation layers.

The package substrate may include signal patterns and a power layer.

The second solder balls may be on at least both edges of the package substrate in the peripheral region, and at least two of the second solder balls may be on one of opposite edges of the package substrate in the peripheral region.

The package cap may include conductive metal.

The semiconductor package may further include an adhesive pattern disposed between the package cap and the package substrate.

The semiconductor package may further include a thermal interface material layer on the semiconductor chip to contact the package cap. The thermal interface material layer may contact the package cap.

According to an example embodiment, a semiconductor package may include a package substrate having a chip mounting region and a peripheral region and including a ground layer, a semiconductor chip on the package substrate in the chip mounting region, and a package cap covering the semiconductor chip. The package cap may be electrically connected to the ground layer in the peripheral region of the package substrate.

The package cap may comprise conductive metal.

The semiconductor package may further include a thermal interface material layer on at least one of the semiconductor chip and a molding layer covering the semiconductor chip to contact the package cap to dissipate heat generated in the semiconductor chip.

BRIEF DESCRIPTION OF THE DRAWINGS

Example embodiments will be more clearly understood from the following brief description taken in conjunction with the accompanying drawings.

FIG. 1 is a cross sectional view illustrating a semiconductor package according to an example embodiment.

FIG. 2 is a plan view illustrating a semiconductor package according to an example embodiment.

FIGS. 3 to 6 are cross sectional views illustrating a method of fabricating a semiconductor package according to an example embodiment.

FIG. 7 is a cross sectional view illustrating a semiconductor package and methods of fabricating the same according to an example embodiment.

FIG. 8 is an enlarged view illustrating a portion of FIG. 7.

Figure 1:
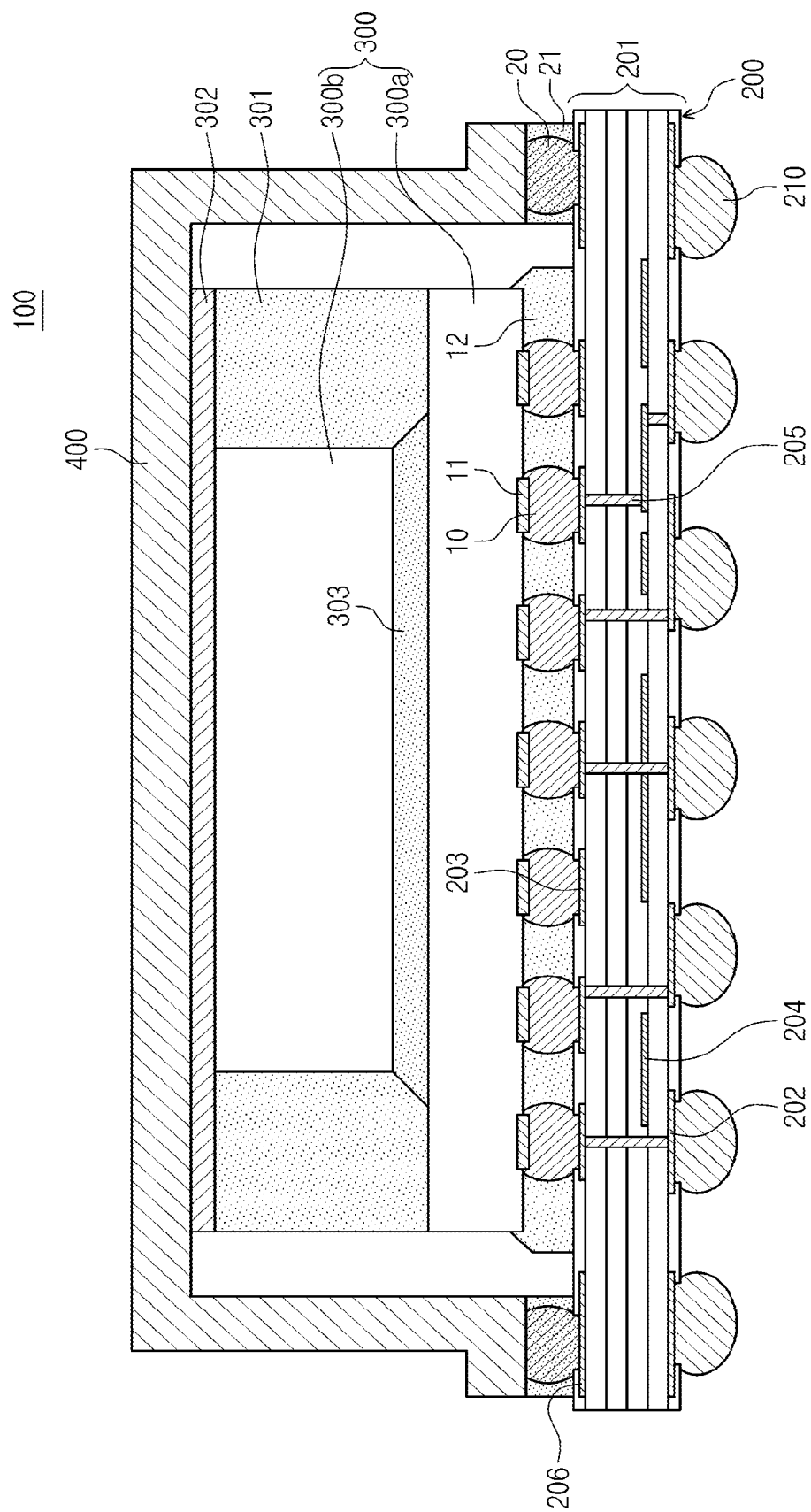
FIGS. 1-8 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments will not be described more fully with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will convey the scope of the disclosure to those of ordinary skill in the art. In the drawings, the sizes and relative sizes of layers and regions may be exaggerated for clarity. Like reference numbers in the drawings denote like elements, and thus their description will be omitted.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. Other words used to describe the relationship between elements or layers should be interpreted in a like fashion (e.g., "between" versus "directly between," "adjacent" versus "directly adjacent").

It will be understood that, although the terms "first," "second," etc. may be used herein to describe various elements, components, regions, layers and/or sections should not be limited by these terms. These terms are only used to distinguish one element, component, region, layer or section from another element, component, region, layer or section. Thus, a first element could be termed a second element without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein the term "and/or" includes any and all combinations of one or more of the associated listed items. Example embodiments explained and illustrated herein include their complementary counterparts.

Figure 2:
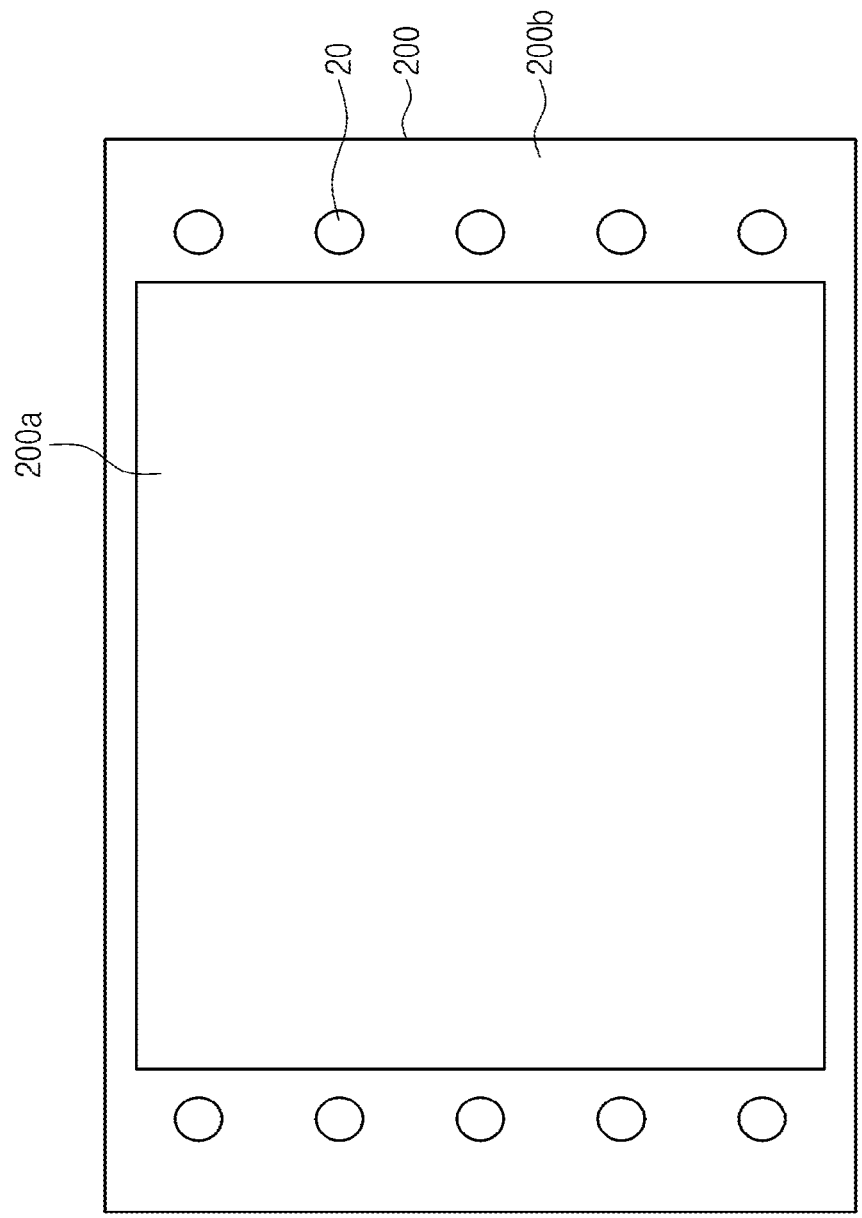

FIG. 1 is a cross sectional view illustrating a semiconductor package according to an example embodiment, and FIG. 2 is a plan view illustrating a semiconductor package according to an example embodiment.

Referring to FIGS. 1 and 2, a semiconductor package 100 according to the example embodiments may include at least one semiconductor chip 300 mounted on a package substrate 200. The semiconductor chip 300 and the package substrate 200 may be covered with a package cap 400.

The package substrate 200 may have a chip mounting region 200a and a peripheral region 200b. The chip mounting region 200a may be a region on which the semiconductor chip 300 is mounted, and the peripheral region 200b may be a region that the package cap 400 contacts the package substrate 200. Second solder balls 20 may be disposed on the package substrate 200 in the peripheral region 200b. The number of the second solder balls 20 may be two or more.

The package substrate 200 may be a multi-layered printed circuit board. The package substrate 200 may include a plurality of insulation layers 201 vertically stacked. For example, the package substrate 200 may have a laminated structure. First signal patterns 202 may be disposed on a lowermost layer of the plurality of insulation layers 201 opposite to an uppermost layer of the plurality of insulation layers 201. The first signal patterns 202 may include at least one package cap signal pattern, at least one chip ground signal pattern and at least one power signal pattern. Second signal patterns 203 may be disposed on the uppermost insulation layer of the plurality of insulation layers 201 opposite to the lowermost insulation layer. The second signal patterns 203 may include at least one package cap signal pattern, at least one chip ground signal pattern and at least one power signal pattern. A power layer 204 may be disposed between the insulation layers 201.

A ground layer 206 may be disposed on a top surface of the package substrate 200. The ground layer 206 may be disposed on the package substrate 200 in the peripheral region (200b of FIG. 2). The ground layer 206 may be electrically connected to the package cap 400. Thus, the package cap 400 may be grounded through the ground layer 206.

The first signal patterns 202, the second signal patterns 203, the power layer 204 and the ground layer 206 may include a conductive layer. The package substrate 200 may include a plurality of through substrate vias 205 that penetrate at least one insulation layers 201. The through substrate vias 205 may include at least one package cap through via, at least one chip ground through via, and at least one power through via.

External solder balls 210 may be disposed on the first signal patterns 202 opposite to the second signal patterns 203. The external solder balls 210 may include at least one external package cap solder ball, at least one external chip ground solder ball and at least one external power solder ball.

The semiconductor chip 300 may be mounted on a surface of the package substrate 200 opposite to the first signal patterns 202. The semiconductor chip 300 may include a plurality of chips vertically stacked. For example, the semiconductor chip 300 may include a first semiconductor chip 300a and a second semiconductor chip 300b that are sequentially stacked on the package substrate 200. Therefore, the second semiconductor chip 300b may be stacked on the first semiconductor chip 300a. The second semiconductor chip 300b may have a narrower width than the first semiconductor chip 300a. The first and second semiconductor chips 300a and 300b may be electrically connected to each other through internal solder balls (not shown) disposed therebetween, and a space between the internal solder balls may be filled with an under-fill resin layer. According to an example embodiment, the first semiconductor chip 300a may be a logic chip and the second semiconductor chip 300b may be a memory chip. The semiconductor chip 300 may be mounted on the package substrate 200 using a flip chip bonding method.

Chip ball lands 11 may be disposed on a bottom surface of the first semiconductor chip 300a, and the chip ball lands 11 may be electrically connected to the second signal patterns 203. First solder balls 10 may be disposed between the chip ball lands 11 and the second signal patterns 203. The semiconductor chip 300 may be electrically connected to the package substrate 200 through the first solder balls 10. A space between the first solder balls 10 may be filled with an under-fill resin layer 12. The semiconductor chip 300 may be covered with a molding layer 301. The molding layer 301 may include an epoxy resin type material.

The package cap 400 may be disposed on the semiconductor chip 300 opposite to the package substrate 200. The package cap 400 may include metal. The package cap 400 may be electrically connected to the package substrate 200 and may be disposed to cover the semiconductor chip 300. A thermal interface material layer 302 may be disposed between the package cap 400 and the second semiconductor chip 300b and/or between the package cap 400 and the molding layer 301. The thermal interface material layer 302 may include a thermal grease material, an epoxy material or a material having metal particles, e.g., indium. The thermal interface material layer 302 may have a solid state at a relatively low temperature and may be changed into a liquid state at a relatively high temperature. The thermal interface material layer 302 may have an adhesive property and/or a conductive property.

Second solder balls 20 may be disposed between the package cap 400 and the package substrate 200 in the peripheral region 200b. For example, the second solder balls 20 may be disposed between edges of the package cap 400 and the ground layer 206 in the peripheral region 200b. The second solder balls 20 may electrically connect the package cap 400 to the package substrate 200.

A package adhesive pattern 21 may be disposed between the edges of the package cap 400 and the package substrate 200 in the peripheral region 200b. The package adhesive pattern 21 may fill spaces between the second solder balls 20. The package adhesive pattern 21 may help adhesion between the package cap 400 and the package substrate 200. For example, the package adhesive pattern 21 may attach the package cap 400 to the package substrate 200. The package adhesive pattern 21 may include an insulation material.

FIGS. 3 to 6 are cross sectional views illustrating a method of fabricating a semiconductor package according to an example embodiment.

Figure 3:
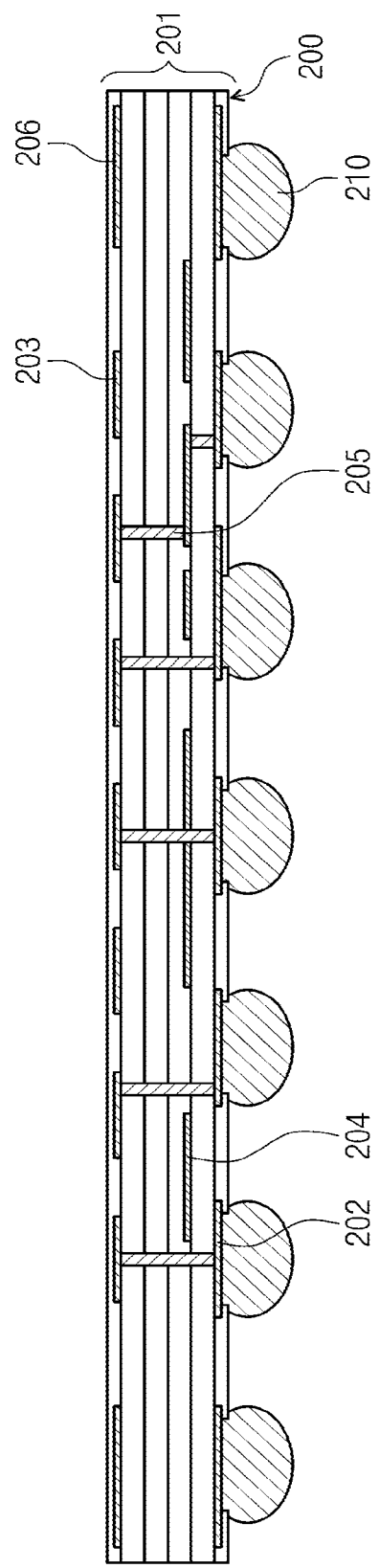

Referring to FIG. 3, a package substrate 200 may be provided. The package substrate 200 may have a chip mounting region (200a of FIG. 2) and a peripheral region (200b of FIG. 2). The package substrate 200 may be a multi-layered printed circuit board. The package substrate 200 may be formed to include a plurality of insulation layers 201 vertically stacked.

Second signal patterns 203 and a ground layer 206 may be formed on a top surface of an uppermost layer of the insulation layers 201. First signal patterns 202 may be formed on a bottom surface of a lowermost layer of the insulation layers 201 opposite to the uppermost insulation layer, and a power layer 204 may be formed on an insulation layer between the uppermost and the lowermost insulation layers. The second signal patterns 203 may be electrically connected to the power layer 204 and/or the first signal patterns 202 by through substrate vias 205 that penetrate at least one of the insulation layers 201. The ground layer 206 may be formed on the package substrate 200 in the peripheral region 200b. External solder balls 210 may be formed on a bottom surface of the package substrate 200 opposite to the second signal patterns 203. The external solder balls 210 may be formed to contact the first signal patterns 202.

Figure 4:
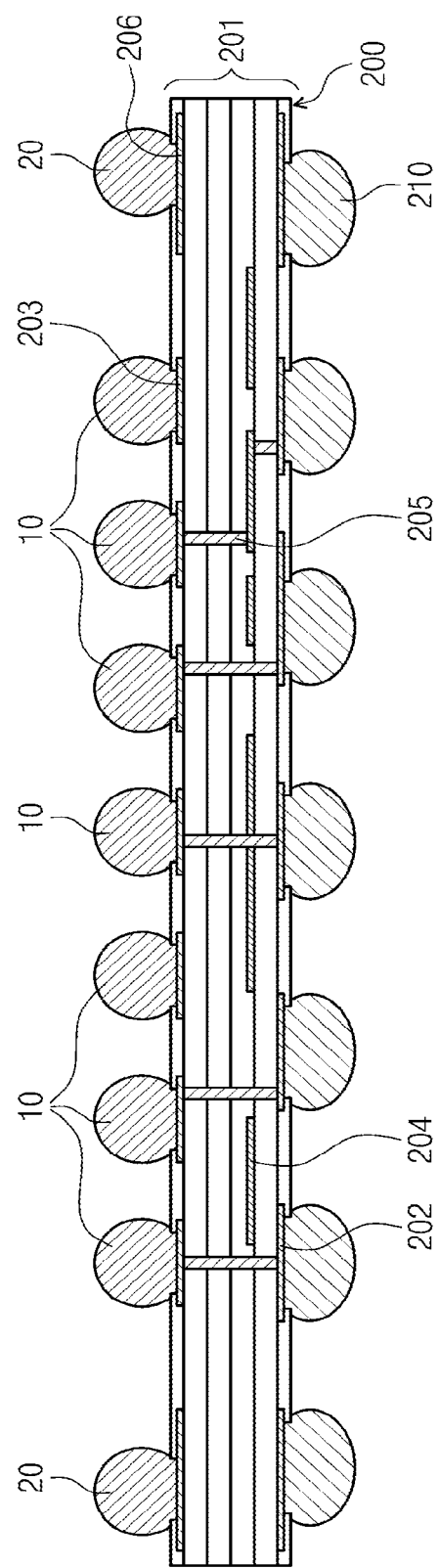

Referring to FIG. 4, first solder balls 10 and second solder balls 20 may be formed on the package substrate 200 opposite to the external solder balls 210. The external solder balls 210 may be formed while the first solder balls 10 and second solder balls 20 are formed. Alternatively, the external solder balls 210 may be formed after formation of a package cap described in a subsequent process. Prior to formation of the first and second solder balls 10 and 20, a protection layer may be formed on the package substrate 200. The protection layer may be formed to expose the second signal patterns 203 and the ground layer 206. The first and second solder balls 10 and 20 may be formed to contact the exposed second signal patterns 203 and the exposed ground layer 206, respectively. The second signal patterns 203 and the ground layer 206 may be exposed using a photolithography process and an etching process. For example, a photoresist layer may be formed on the protection layer, and the photoresist layer may be patterned using an exposure process and a development process. In addition, the protection layer may be etched using the patterned photoresist layer as an etch mask, thereby exposing the second signal patterns 203 and the ground layer 206.

The first solder balls 10 may be formed on the exposed second signal patterns 203, and the second solder balls 20 may be formed on the exposed ground layers 206. The first and second solder balls 10 and 20 may be simultaneously formed.

Figure 5:
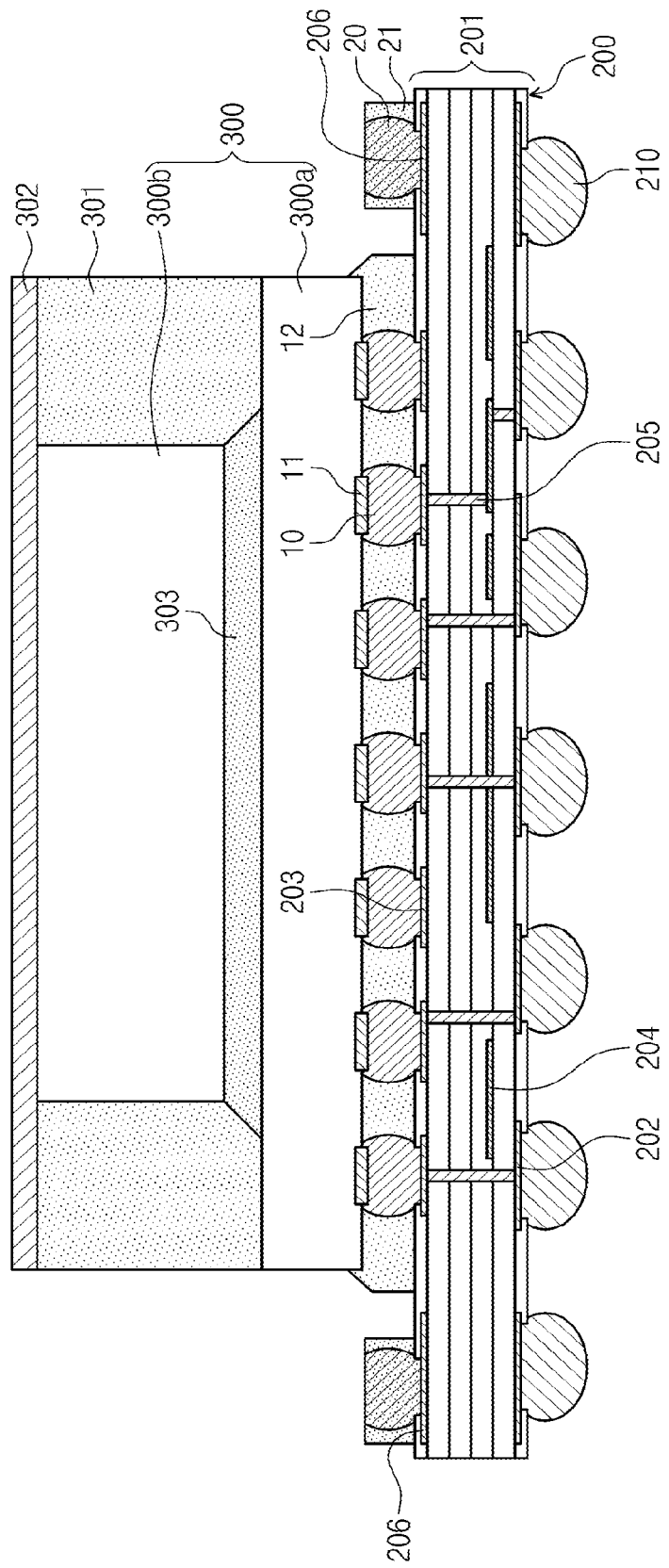

Referring to FIG. 5, a semiconductor chip 300 may be mounted on the package substrate 200. Before the semiconductor chip 300 is mounted on the package substrate 200, chip ball lands 11 may be formed on a bottom surface of the semiconductor chip 300. While the semiconductor chip 300 is mounted on the package substrate 200, the chip ball lands 11 may contact the first solder balls 10. As a result, the semiconductor chip 300 may be electrically connected to the package substrate 200 through the first solder balls 10. The semiconductor chip 300 may be mounted on the package substrate 200 using a flip chip bonding method. A space between the semiconductor chip 300 and the package substrate 200 may be filled with an under-fill resin layer 12.

A molding layer 301 may be formed to cover sidewalls of the semiconductor chip 300. A thermal interface material layer 302 may be then formed on top surfaces of the molding layer 301 and/or the semiconductor chip 300. The thermal interface material layer 302 may be formed, for example, using a paste technique, an inkjet printing technique or a spin coating technique.

Figure 6:
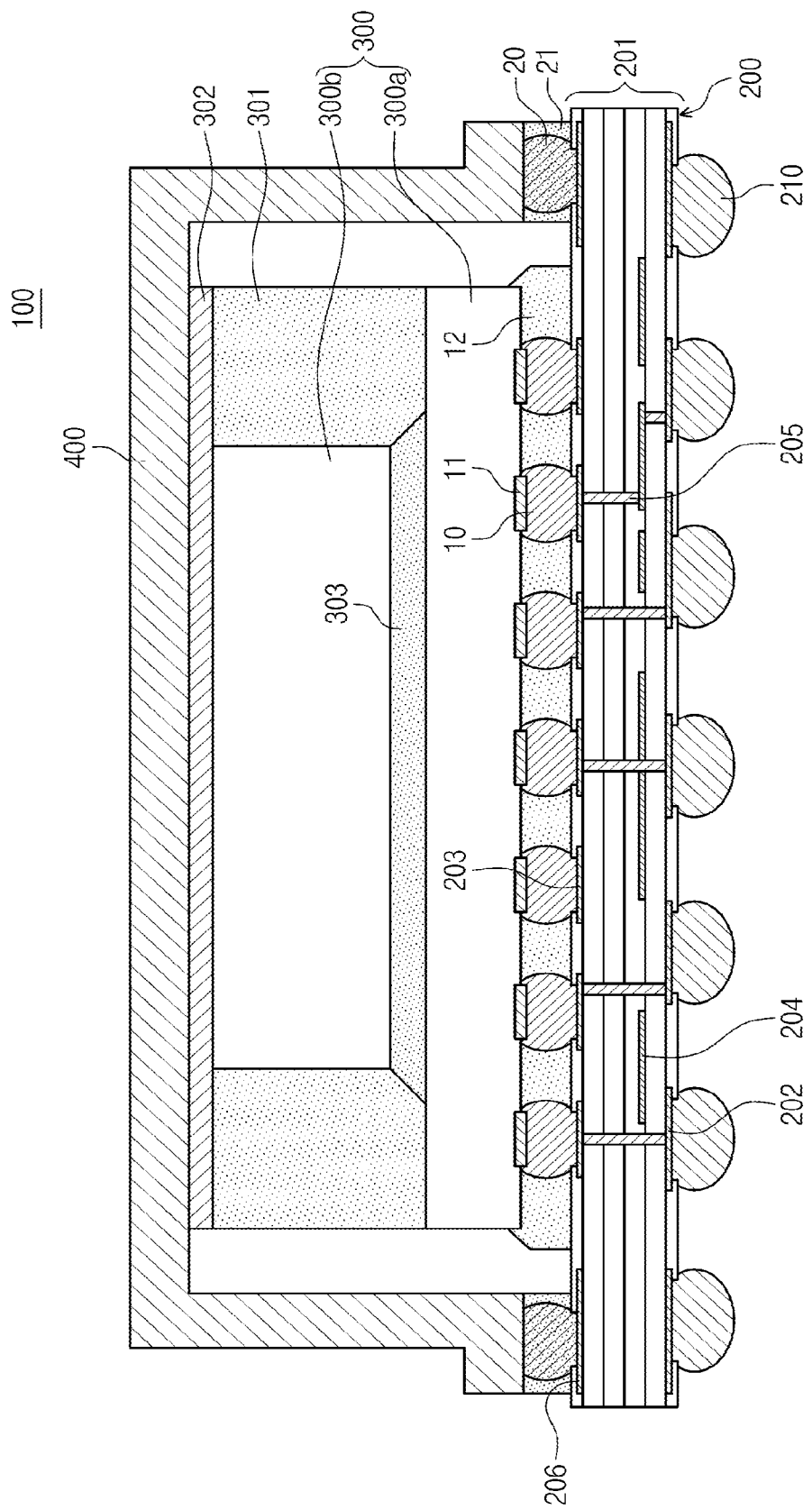

Referring to FIG. 6, after formation of the thermal interface material layer 302, a package cap 400 may be attached to the package substrate 200 to cover the semiconductor chip 300. The package cap 400 may be attached to the package substrate 200 to contact the second solder balls 20. After the package cap 400 is attached to the package substrate 200, a package adhesive pattern 21 may be formed between edges of the package cap 400 and the ground layer 206 on the package substrate 200. The package adhesive pattern 21 may be formed to fill a space between the second solder balls 20. The package adhesive pattern 21 may attach the package cap 400 to the package substrate 200. The package cap 400 may be formed of a conductive material, and the package adhesive pattern 21 may be formed of an insulation material.

According to an example embodiment, the package cap 400 may have a heat radiation function and may prevent or reduce the package substrate 200 from being warped. Further, a semiconductor package 100 according to example embodiments may be formed such that the package cap 400 is electrically connected to the ground layer 206 on the package substrate 200 to act as a shield plate of electromagnetic waves. Thus, any additional components to protect and shield the semiconductor chip 300 from external electromagnetic waves are not required at a semiconductor module level or at a mother board level. As a result, according to example embodiments, assembly processes can be simplified.

Figure 7:
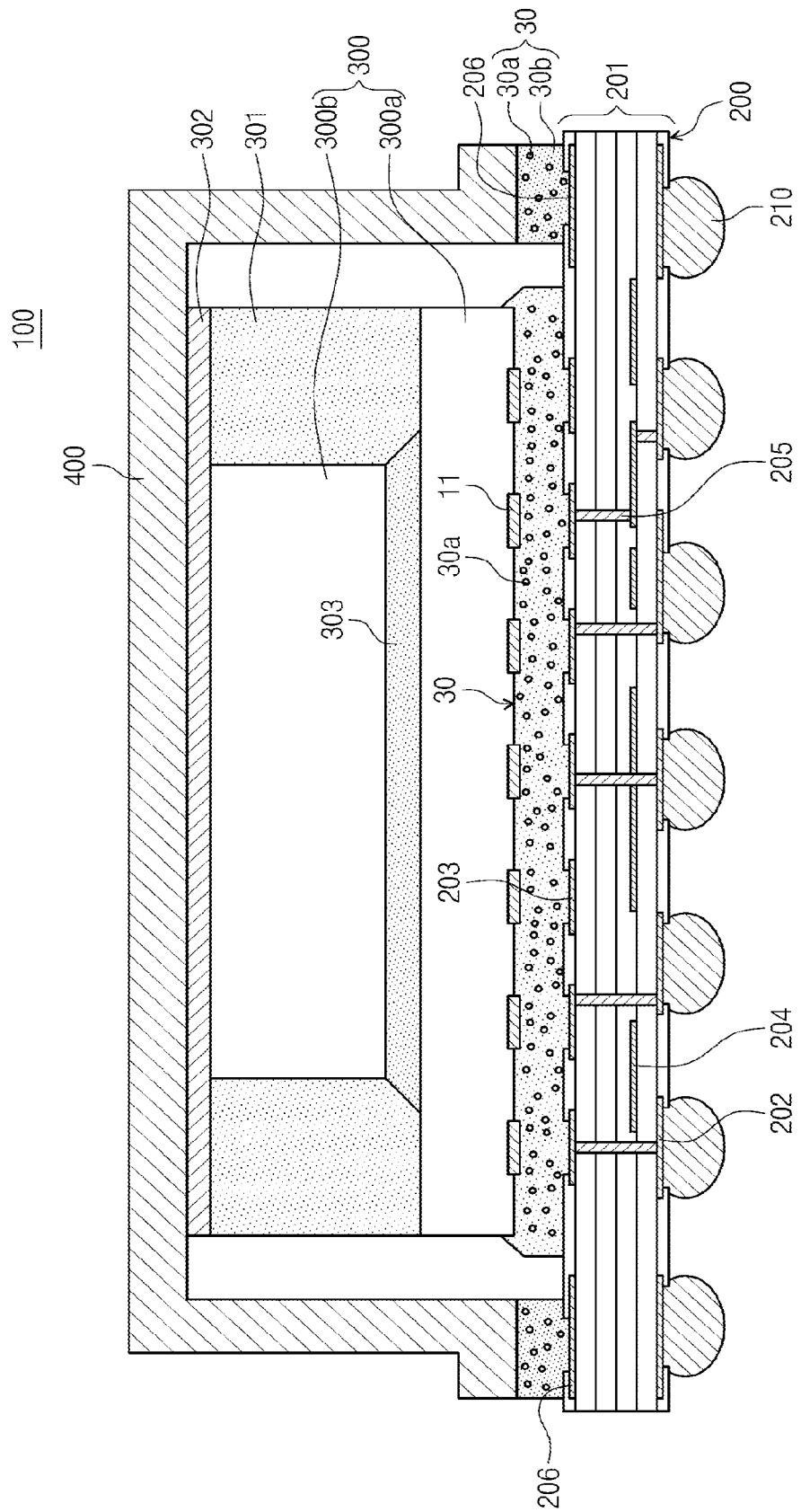
Figure 8:
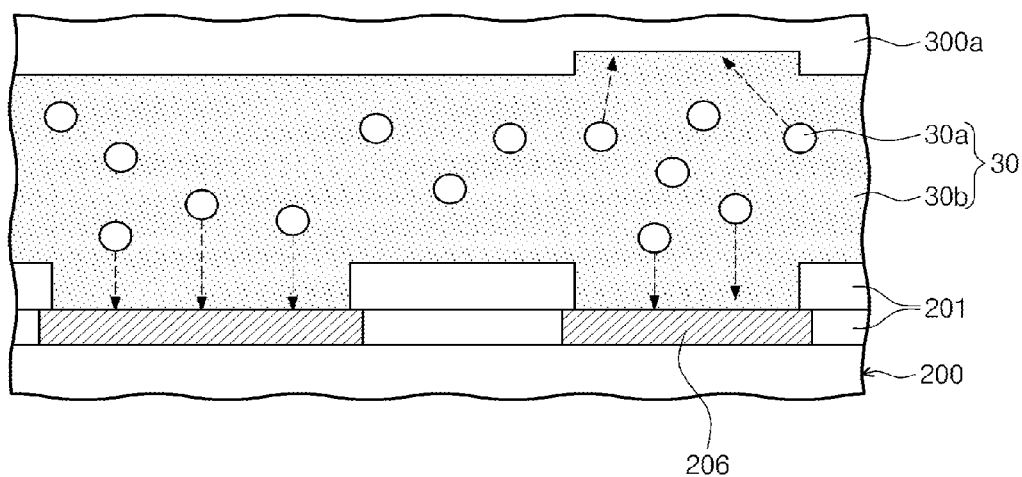

FIG. 7 is a cross sectional view illustrating a semiconductor package according to another example embodiments and methods of fabricating the same, and FIG. 8 is an enlarged view illustrating a portion of FIG. 7. For the purpose of simplification in explanation, descriptions to the same components as illustrated in the previous example embodiments will be omitted or mentioned briefly.

Referring to FIG. 7, a mixture material 30 including solder particles 30a and adhesive resin 30b may be coated on a package substrate 200. The mixture material 30 may be formed to bond a semiconductor chip 300 and/or a package cap 400 to the package substrate 200. The solder particles 30a and the adhesive resin 30b in the mixture material 30 may be mixed in a desired (or, alternatively a predetermined) volume ratio, for example, in a volume ratio of about 1:9 to about 5:5, respectively. Each of the solder particles 30a may have a diameter of about 0.1 μm to about 100 μm. The solder particles 30a may be metal particles, for example, copper particles, lead particles, tin particles, indium particles, bismuth particles, antimony particles, silver particles, or combination particles thereof. The adhesive resin 30b may be a fluid material. The adhesive resin 30b may have a function to remove oxide layers on surfaces of the solder particles 30a. Further, the adhesive resin 30b may have an adhesive property. The adhesive resin 30b may include an epoxy type resin material, for example, a bisphenol-A material or an epichlorohydrin material. The mixture material 30 may further include a reducing agent, a deforming agent, a solvent and/or a hardening agent. The hardening agent may be a silicon type material, a phenol type material, an acid anhydride type material or an amine type material. The mixture material 30 may further include a thermal setting agent, a thermal plastic agent and/or an ultraviolet curing material.

After the mixture material 30 is coated on the package substrate 200, a semiconductor chip 300 and a package cap 400 may be mounted on the mixture material 30. While the semiconductor chip 300 and the package cap 400 are mounted on the mixture material 30, the package substrate 200 may be heated up to a high temperature over a melting point of the solder particles 30a. Thus, the adhesive resin 30b may also be heated up. The heated adhesive resin 30b may remove oxide layers on surfaces of the solder particles 30a. According to an example embodiment, when the mixture material 30 includes the deforming agent, the deforming agent may suppress generation of gases or bubbles in the mixture material 30 to improve an adhesiveness of the solder particles 30a to metal layers such as second signal patterns 203 and ground layers 206 formed on the package substrate 200 as well as chip ball lands 11 formed on a bottom surface of the semiconductor chip 300. While the package substrate 200 is heated up, the solvent in the mixture material 30 may be removed to cure the adhesive resin 30b and to form a resin layer.

Referring to FIG. 8, while the package substrate 200 is heated up to a high temperature over a melting point of the solder particles 30a, the solder particles 30a may be moved in directions indicated by arrows to stick onto the second signal patterns 203, the ground layers 206 and the chip ball lands 11. As a result, first solder balls 10 may be formed between the chip ball lands 11 and the second signal patterns 203, and second solder balls 20 may be formed between the ground layers 206 and the package cap 400, as illustrated in FIG. 6.

The solder particles 30a may be stuck onto not only top surfaces of the second signal patterns 203, the ground layers 206 and the chip ball lands 11 but also sidewalls of the second signal patterns 203, the ground layers 206 and the chip ball lands 11. Accordingly, a surface area of metal patterns, for example, the chip ball lands 11 to which the solder particles 30a are attachable may be increased to reduce the number of the solder particles 30a floated in the adhesive resin 30b. Thus, electrical shortages and/or leakage currents between the solder balls 10 and 20 may be remarkably reduced to prevent or reduce malfunction and/or signal interference of the semiconductor package 100. As a result, the reliability of the semiconductor package 100 can be improved.

According to an example embodiment, a semiconductor chip may be mounted on a package substrate, and a package cap may be mounted on the package substrate to cover the semiconductor chip. The package cap may be electrically connected to ground layers formed on the package substrate. Further, the package cap may have a heat radiation function. Thus, the package cap may act as a shield plate to protect the semiconductor chip from external electromagnetic waves and may prevent malfunction of the semiconductor chip even though the semiconductor chip is heated up while the semiconductor chip operates. Therefore, a semiconductor package having improved reliability may be realized. Further, the package cap may be attached to the package substrate. Thus, the package cap may prevent or reduce the package substrate from being warped. Accordingly, any additional components to protect and shield the semiconductor chip 300 from the external electromagnetic waves may not be required at a semiconductor module level or at a mother board level. As a result, assembly processes can be simplified.

In addition, according to example embodiments, the package cap may be attached to the package substrate by solder balls and a package adhesive pattern formed between the package cap and the package substrate. Thus, there is no need to form holes for attaching a shield can or a heat sink plate to the package substrate, a module substrate or a mother board.

While example embodiments have been particularly shown and described, it will be apparent to those skilled in the art that various changes and modifications may be made without departing from the spirit and scope of the inventive concept. Therefore, it should be understood that the above example embodiments are not limiting, but illustrative. Thus, the scope of the inventive concepts is to be determined by the broadest reasonable interpretation of the following claims and their equivalents, and shall not be restricted or limited by the foregoing description.

What is claimed is:

1. A semiconductor package comprising:
a package substrate having a chip mounting region and a peripheral region, the package substrate including a ground layer in the peripheral region;
first solder balls on the package substrate in the chip mounting region;
second solder balls on the ground layer;
at least one semiconductor chip on the package substrate in the chip mounting region, the at least one semiconductor chip electrically connected to the first solder balls; and
a package cap covering the semiconductor chip and contacting the package substrate in the peripheral region, the package cap electrically connected to the second solder balls,
wherein the package substrate includes signal patterns and a power layer.

2. The semiconductor package of claim 1, wherein the package substrate includes a plurality of insulation layers.

3. The semiconductor package of claim 1, wherein the second solder balls are on at least both edges of the package substrate in the peripheral region, and at least two of the second solder balls are on one of opposite edges of the package substrate in the peripheral region.

4. The semiconductor package of claim 1, wherein the package cap comprises conductive metal.

5. The semiconductor package of claim 1, further comprising:
an adhesive pattern between the package cap and the package substrate.

6. The semiconductor package of claim 1, further comprising:
a thermal interface material layer on the semiconductor chip, the thermal interface material layer contacting the package cap.

7. A semiconductor package comprising:
a package substrate having a chip mounting region and a peripheral region, the peripheral region including a ground layer;
a semiconductor chip on the package substrate in the chip mounting region;
a package cap covering the semiconductor chip, the package cap electrically connected to the ground layer in the peripheral region of the package substrate; and
a thermal interface material layer on at least one of the semiconductor chip and a molding layer covering the semiconductor chip to contact the package cap to dissipate heat generated in the semiconductor chip.

8. The semiconductor package of claim 7, wherein the package cap includes conductive metal.

9. A semiconductor package comprising:
a package substrate having a chip mounting region and a peripheral region, the package substrate including a ground layer in the peripheral region;
first solder balls on the package substrate in the chip mounting region;
second solder balls on the ground layer;
at least one semiconductor chip on the package substrate in the chip mounting region, the at least one semiconductor chip electrically connected to the first solder balls; and
a package cap covering the semiconductor chip and contacting the package substrate in the peripheral region, the package cap electrically connected to the second solder balls,
wherein the second solder balls are on at least both edges of the package substrate in the peripheral region, and at least two of the second solder balls are on one of opposite edges of the package substrate in the peripheral region.

10. The semiconductor package of claim 9, wherein the package substrate includes a plurality of insulation layers.

11. The semiconductor package of claim 9, wherein the package cap comprises conductive metal.

12. The semiconductor package of claim 9, further comprising:
    an adhesive pattern between the package cap and the package substrate.

13. The semiconductor package of claim 9, further comprising:
    a thermal interface material layer on the semiconductor chip, the thermal interface material layer contacting the package cap.

* * * * *